United States Patent [19]

Bono et al.

[11] Patent Number: 5,750,420
[45] Date of Patent: May 12, 1998

[54] METHOD FOR MANUFACTURING A STRUCTURE WITH A USEFUL LAYER HELD AT A DISTANCE FROM A SUBSTRATE BY ABUTMENTS, AND FOR DETACHING SUCH A LAYER

[75] Inventors: Hubert Bono, Jauie; France Michel, Sassenage; Patrice Rey, Jean de Moirans, all of France

[73] Assignee: Commissariat a l'Energie Atomique, Paris, France

[21] Appl. No.: 676,629

[22] Filed: Jul. 10, 1996

[30] Foreign Application Priority Data

Jul. 21, 1995 [FR] France ................... 95 08882

[51] Int. Cl.⁶ .................................... H01L 21/00
[52] U.S. Cl. .................................... 438/52
[58] Field of Search .............. 437/228 H, 228 SEN, 437/901, 927; 257/417, 418, 419; 73/514.32, 514.36; 216/2; 438/50, 52

[56] References Cited

U.S. PATENT DOCUMENTS

| | | |
|---|---|---|
| 4,999,735 | 3/1991 | Wilner . |
| 5,203,731 | 4/1993 | Zimmerman ................. 437/927 |
| 5,258,097 | 11/1993 | Mastrangelo . |
| 5,397,904 | 3/1995 | Arney et al. ................. 257/417 |
| 5,616,523 | 4/1997 | Benz et al. ................. 437/228 |

FOREIGN PATENT DOCUMENTS

| | | |
|---|---|---|
| 0 386 464 | 9/1990 | European Pat. Off. . |
| 0 605 300 | 7/1994 | European Pat. Off. . |
| 4317274 | 1/1994 | Germany . |

*Primary Examiner*—Brian Dutton
*Attorney, Agent, or Firm*—Burns, Doane, Swecker & Mathis, LLP

[57] ABSTRACT

A method of manufacturing a structure with a useful layer (120) held at a distance from a substrate (100) by abutments (150, 151) and of detaching such a layer.

This method comprises the following steps:
- a first partial and selective etching of the sacrificial layer leaving at least one spacer paving (140) to survive between the substrate and the useful layer,
- a second selective etching of the useful layer (120) and/or the substrate (100) using the spacer (140) as a mask so as to form at least one abutment (150, 151) in said useful layer and/or the substrate,
- removal of said spacer.

9 Claims, 3 Drawing Sheets

METHOD FOR MANUFACTURING A STRUCTURE WITH A USEFUL LAYER HELD AT A DISTANCE FROM A SUBSTRATE BY ABUTMENTS, AND FOR DETACHING SUCH A LAYER

TECHNICAL FIELD

This invention relates to a method for detaching a useful layer connected to a substrate by means of a sacrificial layer.

It also relates to a method for manufacturing a structure with a useful layer held at a distance from a substrate by abutments formed in the useful layer and/or the substrate.

One understands by useful layer, a layer of material or a portion of such a layer which comes into the manufacture particularly of a micro-mechanical type of structure.

The invention finds applications particularly for the manufacture of micro-actuators, micro-pumps, micro-motors, accelerometers, sensors for electrostatic or electro-magnetic detection and more generally, for the manufacture of any micro-mechanical system involving the use of a sacrificial layer.

STATE OF PRIOR ART

When the manufacture of a micro-mechanical system requires separation of certain parts of this system at a distance of the order of, or less than, one micron, a sacrificial layer is usually used.

This sacrificial layer allows one to control the distance between the interacting parts and to preserve the integrity of the system during the different steps of manufacture.

The control of the distances between the interacting parts is essential to obtain systems with high micro-mechanical performance. In effect, during their manufacture, the physical phenomena involved depend generally inversely on the interaction distance. Whatever may be the way of producing the sacrificial layer, it is etched by a method that is sufficiently selective not to damage the surrounding structure of the micro-mechanical system and, in particular, the parts that the sacrificial structure was connecting together. When the sacrificial layer is removed, one or several of these parts is/are generally mobile.

In most cases, the etching of the sacrificial layer is carried out chemically. Afterwards, such etching poses the delicate problem of drying the solvent used for rinsing the structure. In effect, during drying, the moving parts are subjected to attractive forces induced by the curvature of the liquid vapour solvent interface, as FIG. 1 shows. These capillarity forces arise from the surface tension of the rinsing liquid in equilibrium with its vapour on the solid.

FIG. 1 is a very schematic section of a micro-mechanical structure during drying, after removal by chemical means of a sacrificial layer. Between parts 10 and 12 of this structure, initially joined by the sacrificial layer there is a solvent residue 14. θ1 and θ2 designate the wetting angles at the liquid/solid/vapour triple points, b is the length of the liquid/solid interface and d is the distance between parts 10 and 12. Hence the expression for the transverse force per unit length q which is exerted on parts 10 and 12 is given by the following equation:

$$q = \gamma \cdot (\cos \theta_1 + \cos \theta_2) \cdot b$$

where γ is the liquid/solid surface tension.

During the drying of the solvent 14, the distance d decreases due to the capillarity forces being exerted on parts 10 and 12. This has the effect of increasing these same forces and this continues until inescapable sticking of the mobile parts 10 and 12 occurs. Furthermore, when the distance between parts 10 and 12 is of the order of magnitude of interatomic distances, the forces of attraction become Van der Waals type forces, and the sticking becomes irreversible.

This sticking prevents mobility of parts 10 and/or 12 and compromises the manufacture of the micro-mechanical structure.

To resolve the problem of sticking, it is possible to take action either on the physico-chemical parameter of surface tension (γ) or on the geometric parameters of the structure to be produced.

In effect, to avoid sticking, one solution consists of decreasing or indeed eliminating the surface tension. In a document (1) given as a reference at the end of this description, G. Mulhern suggests eliminating the liquid/vapour interface by resorting to conditions of temperature and pressures known as supercritical conditions. Under these conditions, one cannot differentiate between the liquid and the vapour. Hence, the liquid/vapour interface and hence the surface tension doesn't exist any more. As an example, when silica is used as a sacrificial layer, this is etched by a solution of hydrofluoric acid. After the etching, the structure is rinsed with de-ionised water which is, itself, rinsed with methanol by dilution. In its turn, the methanol is diluted by liquid carbon dioxide in an enclosure brought under a pressure of the order of 80 atmospheres. After the disappearance of the methanol, the enclosure is insulated and brought to a temperature of 35° C. which has the effect of increasing the pressure and passing the supercritical transition. It only remains to evacuate the carbon dioxide and restore atmospheric pressure.

Another possibility for avoiding sticking between parts of a structure, separated through the removal of a sacrificial layer, consists of limiting the contact areas of these parts during drying, and hence, making the drying reversible. For this it is enough that the forces of repulsion acting on the (mobile) part(s) should be greater than the forces of attraction which are proportional to the area of the parts in contact.

The problem of sticking can also occur if the two surfaces come into contact because of an external stress. In document (2) given as a reference at the end of this description, Wiegand provides an accelerometer with capacitive detection made up of three substrates, independently machined then sealed up. The central substrate forms a seismic mass, while the upper and lower substrates comprise the abutments that limit the contact surface with the seismic mass in the event of coming together.

In the document (3) the reference of which is given at the end of this description, Wilner provides the same type of assembly but positioning the abutments on the central substrate in which the seismic mass is machined.

In the document (4) the reference of which is given at the end of this description, the authors suggest an accelerometer structure produced by stacking layers. In this case, a depression is made in a sacrificial layer covered by a layer in which the seismic mass is machined. After etching of the sacrificial layer, the depression is replaced by an abutment on the mobile part.

Yet another solution to avoid sticking of parts 10, 12 of a structure conforming to FIG. 1, after the removal of the sacrificial layer can be to increase the roughness of the surfaces with respect to these parts, and hence to limit the adhesive forces in the event of sticking. Alley R. and co-authors show how to produce and to control this roughness.

All of the methods mentioned above assume that the surfaces liable to come into contact can be accessible and machinable during the course of manufacture. Unfortunately, in order to improve the performance of micro-mechanical systems, it is often necessary to reduce the thickness of the sacrificial layer and to have a material of good quality. Furthermore, for reasons of technological compatibility with micro-electronic devices, the material used most in micro-mechanics is mono-crystalline silicon. Bearing in mind these two demands, substrates of the silicon on an insulator type are often used. These substrates are made up of a silicon substrate covered with a thin layer of insulator, generally silica, which is itself covered by a thin layer of mono-crystalline silicon. The insulating layer acts as sacrificial layer, so that it is impossible to machine the surfaces liable to come into contact. Most of the techniques described above and which allow sticking to be avoided are then no longer applicable.

An aim of this invention is, in fact, to suggest a method for detaching a useful layer of material, initially joined to a substrate by a sacrificial layer, which allows the problems of sticking mentioned above to be avoided.

Another aim of this invention is also to provide a method of manufacturing a structure comprising a useful layer held at a distance from a substrate by abutments, which is, at the same time compatible with the techniques of structures of the silicon on an insulator type, the techniques of micro-electronics and with the demands of the manufacture of structures with very fine sacrificial layers.

DESCRIPTION OF THE INVENTION

To achieve the aims mentioned above, the object of the invention is a method for detaching a useful layer joined initially to a substrate by a sacrificial layer, characterised in that it comprises the following steps

- a first partial and selective etching of the sacrificial layer leaving at least one paving to survive forming a spacer between the substrate and the useful layer,
- a second selective etching of the useful layer and/or the substrate using the spacer as a mask so as to form at least one abutment in said useful layer and/or the substrate,
- removal of said spacer.

The useful layer constitutes for example the sensitive element of a sensor, such as a seismic mass of an accelerometer, or a membrane of a pressure sensor. It may also involve a moving part such as the rotor of a micro-motor for example.

According to one aspect of the invention, the first and second etchings can be carried out by a wet route through at least one opening made in the useful layer.

The distribution of the abutments on at least one of the surfaces opposite the useful layer and/or the substrate can be carried out by an arrangement whereby the openings allow access to the intermediate layer and hence allow its etching.

The number of abutments formed is minimised and their distribution is arranged to confer maximum effectiveness on them.

The number and the distribution of the abutments can be advantageously chosen in such a way that the parts opposite the useful layer and the substrate are not able to undergo a deformation deviation greater than a final predetermined distance that must separate them.

In particular, the first etching can be carried out starting from each opening over a distance D approximately equal to $(L-e)/2$, where L is the maximum distance between neighbouring openings and e is a desired characteristic dimension, for example the width, of the abutments.

The invention also relates to a method of manufacturing a structure comprising a useful layer held at a distance from a substrate by abutments formed in the useful layer and/or substrate, characterised in that it comprises

- the formation of an initial structure comprising a stacking from the substrate of a sacrificial layer and a useful layer, the sacrificial layer connecting the useful layer to the substrate, and
- the detachment of the useful layer from the substrate in accordance with the method described above.

In the entire text, one understands by substrate, either a thick layer used to support the useful layer or a second useful layer to be separated from the useful layer mentioned above.

According to one aspect of the invention, the initial structure can be of the silicon on an insulator type.

Such a structure has the advantage of being commonly used in micro-electronics technology and therefore perfectly compatible with the invention.

According to one particular aspect of the invention, the method can be applied to the manufacture of an accelerometer. In this case, the useful layer and the substrate are fitted with electrical means for measuring a relative displacement of this useful layer with respect to the substrate under the effect of an acceleration. The useful layer forms a mobile sensitive mass for such an accelerometer.

Other characteristics and advantages of this invention will become apparent from the description which follows, being non-limitative and given purely for illustration purposes, with reference to the appended Figures.

DESCRIPTION OF WAYS OF IMPLEMENTING THE INVENTION

Figure 1:
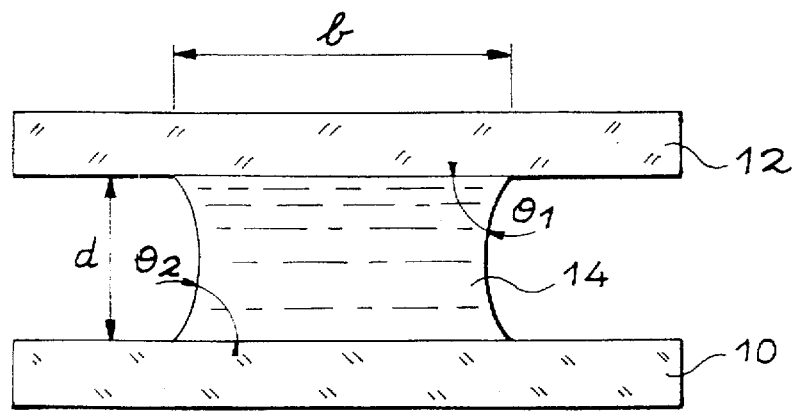
FIG. 1, already described, is a diagrammatic section illustrating the problems of sticking between two parts of a structure after the removal of a sacrificial layer which separates them.
Figure 2:
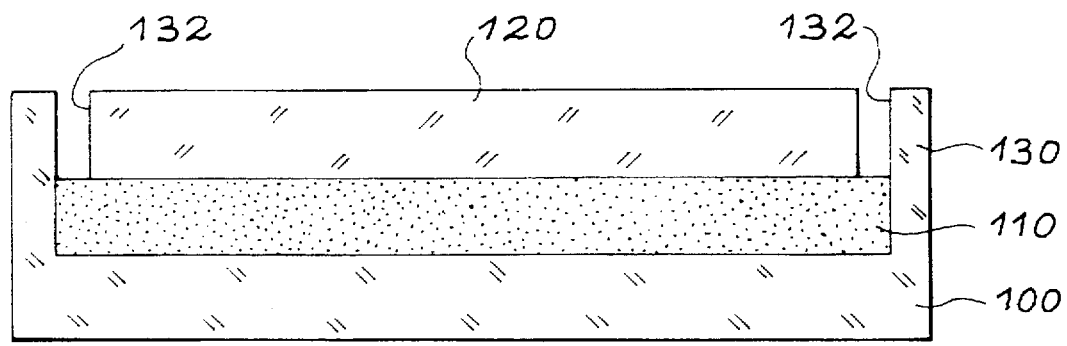
FIGS. 2 to 5 are diagrammatic sections illustrating the different steps of the method of the invention according to one particular implementation of it.

FIG. 2 shows a structure comprising a substrate 100, for example, of silicon, a sacrificial layer 110 of silicon oxide received into the substrate 100 and a so-called useful layer 120 of silicon covering the sacrificial layer. A side edge of substrate 130 laterally surrounds the sacrificial layer.

In the way of implementing the invention that corresponds to this Figure, a first step consists of making the openings 132, for example in the useful layer 120 so as to form access routes to the sacrificial layer 110. In an advantageous way, these openings are made in the useful layer 120 by making profitable use of an etching operation intended to shape the useful layer.

The access routes are used for the etching of layer 110. In the case where the sacrificial layer 110 is made of silicon oxide, the etching can be carried out by attacking this layer 110 through the openings 132 with hydrofluoric acid.

During the etching of the sacrificial layer 110, one or several pavings are allowed to survive between the substrate 100 and the useful layer 120 forming spacers.

Figure 3:
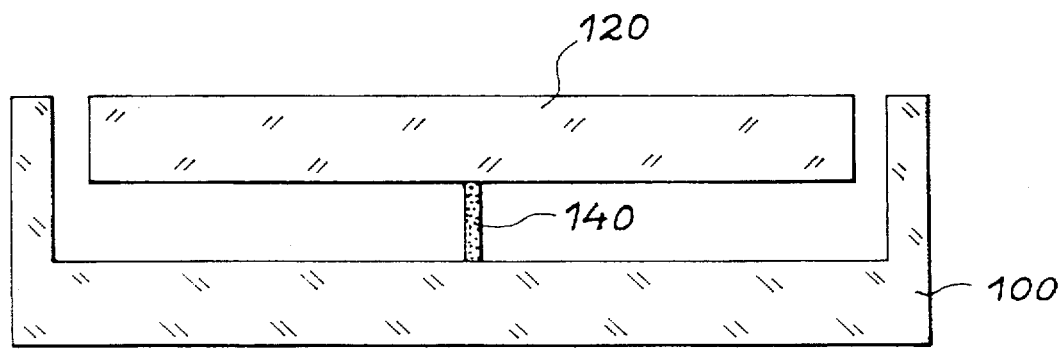

Such a paving is shown in FIG. 3 under reference number 140. One or several pavings thereby formed allow the substrate 100 and the useful layer 120 to be kept at a distance equal to the thickness of the initial sacrificial layer.

A second selective etching, for example with a solution of potash allows attack of the substrate and the useful layer in the space that separates them. During this second etching which does not attack the pavings 140, these form masks and protect the areas of substrate and the useful layer on which they are supported.

Figure 4:
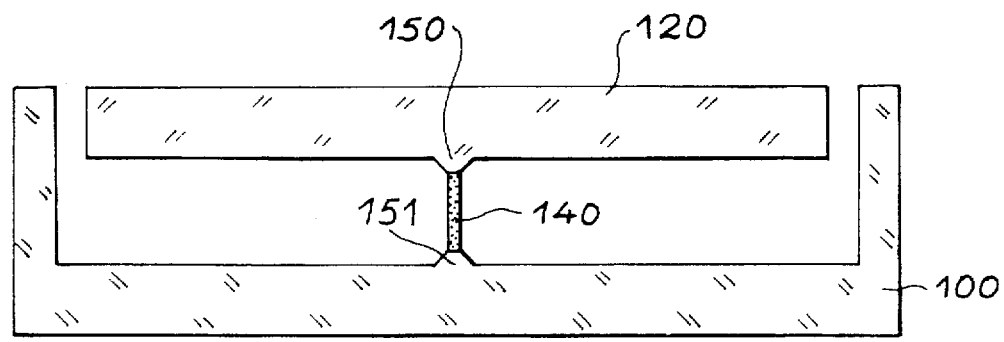

Hence, during the second etching, abutments 150, 151 are formed respectively on the useful layer and on the substrate. These abutments are shown in FIG. 4.

In the case of the example described, the abutments 150 and 151 are opposite each other and are separated by the paving 140. However, it is possible in another embodiment where the substrate and the useful layer are produced from different materials, to only etch one of these parts during the second etching. It is thereby also possible to selectively form abutmentseither on the substrate or on the useful layer.

Figure 5:
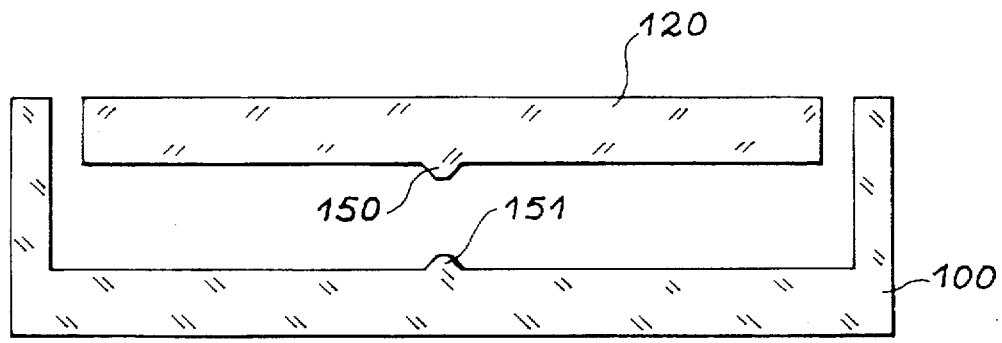

A last step consists of removing the pavings 140 surviving between the abutments 150 and 151 during a third etching as FIG. 5 shows.

Hence, at the end of the process, a spacing is kept between the useful layer and the substrate thanks to abutments 150 and 151. The width of this spacing depends on the height of the abutments and hence on the conditions (the depth) of the second etching.

Figure 6:
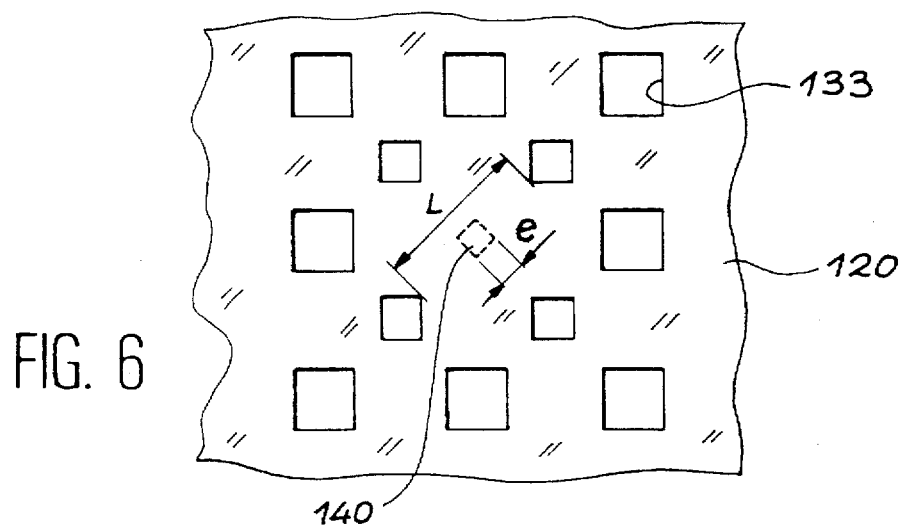
FIG. 6 shows, on a smaller scale, a pattern of openings made in the useful layer of the structure shown in FIGS. 2 to 5.

FIG. 6 gives an example of an etching pattern of openings 132 in the useful layer so as to create central abutments such as those shown in FIG. 5. Squares carrying reference number 133 correspond to openings 132 made in the layer 120 in order to allow a central paving 140 of dimension e to survive.

On the chequered pattern formed by the openings, L designates the distance along a diagonal between neighbouring openings. As mentioned above, in the description, the first etching is carried out over a distance approximately equal to (L–e)/2, measured parallel to the plane of the layer 120.

Furthermore, it is advisable to make it clear that the dimension of the abutments and the pavings is not determined by photolithography, but by control of the kinetics of the etchings. This allows abutments to be produced with dimensions of the order of a micrometer or less than a micrometer. The parameters that determine the dimensions and the height of the abutments are therefore the same as those that govern any chemical etching kinetics, that is to say, the concentration of the reactive species, the temperature and the time.

In practice, for the etching, it suffices to use a solution of known concentration, at a controlled temperature and to only be concerned with the time parameter.

A particular application example of the method above is the production of an accelerometer with capacitive detection with an axis approximately parallel to the substrate.

Figure 7:
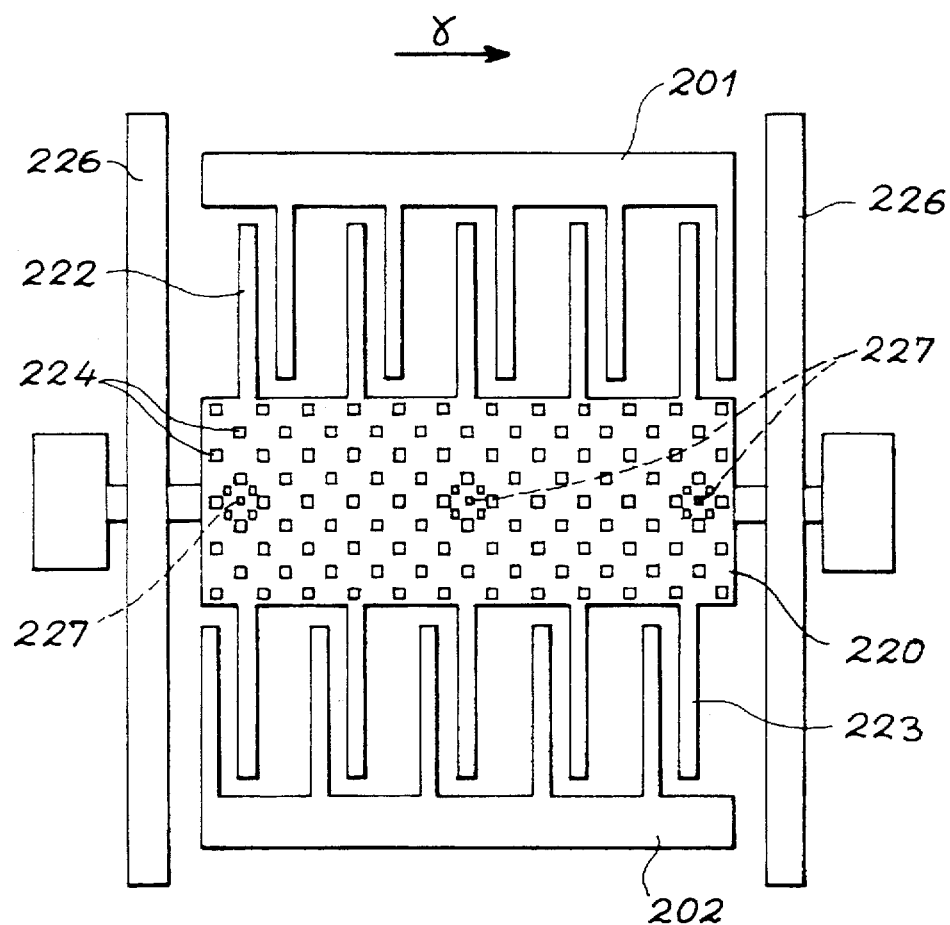
FIG. 7 is a diagrammatic view from above of an accelerometer formed by machining and implementing the invention.

FIG. 7 is a view from above of such an accelerometer. It comprises a mobile seismic mass 220, with fingers 222, 223 interdigited with combs 201, 202 making up the fixed parts of the accelerometer.

The seismic mass 220 is displaced in the direction of the acceleration γ which is applied to it. On the Figure, this acceleration is represented by an arrow.

In addition, the seismic mass is held by beams 226 having a stiffness k. Considering that M is the mass of the mobile part 220, this is displaced by a quantity x expressed by x=Mγ/k under the effect of acceleration γ.

The combs 201, 201 and the fingers 222, 223 of the seismic mass form plates of electrical capacitors.

In the case of FIG. 7, a displacement of the seismic mass corresponds, for example, to an increase in the capacity of the condenser formed between the fingers 222 and the comb 201, denoted $C_{222-201}$ and a decrease in the capacity of the condenser formed between the fingers 223 and the comb 202 denoted $C_{223-202}$.

If the distance, at rest, between fixed fingers and mobile fingers is l, the capacities are of the form:

$$C_{222-201} = \epsilon \cdot \frac{S}{l-x}$$

$$C_{223-202} = \epsilon \cdot \frac{S}{l+x}$$

where ε is the permittivity of the void and S the area of the facing electrodes.

The measurement of $(C_{222-201})-(C_{223-202})$, zero at rest, then gives a value proportional to the acceleration.

The accelerometer in FIG. 7 is made according to a planar manufacturing technique from a substrate of the silicon on an insulator type. This type of substrate can be obtained either by implantation of oxygen into an initial silicon substrate, or by sealing the two substrates one of which has been covered with a thin layer of silicon oxide. In both cases, the structure obtained is made up of three layers: a first very thick layer of silicon, a second very thin sacrificial layer of silicon oxide and a third layer of silicon.

In the case of this example, the sacrificial layer of silicon oxide has a thickness of the order of 0.4 μm while the third layer, or top layer has a thickness of 10 to 20 μm.

The sensitive element of the accelerometer, that is to say the mobile seismic mass 220 is defined by photolithography in the third layer, and constitutes the useful layer in the meaning of this invention.

The detachment of this useful layer is carried out in conformity with the method described above. The openings 224 made in the useful layer in accordance with a pattern comparable to that in FIG. 6 constitute the access routes to the sacrificial layer. These openings are made in the useful layer, advantageously during the step of etching the third layer, which defines the shape of the seismic mass.

A first partial etching of the sacrificial layer is carried out with a solution of hydrofluoric acid. Three pavings of the sacrificial layer designated with reference number 227 are preserved between the substrate and the useful layer, they have a section of the order of 1 μm.

After rinsing by flooding, so that the structure remains in a liquid medium, a selective etching of the silicon of the substrate and of the useful layer 220 is carried out with a solution of potash. The useful layer and the substrate are etched to a depth of the order of 0.1 μm on each of the opposite faces. Abutments are thereby formed in the areas protected by the pavings 227.

At the conclusion of this step, the same type of rinsing as previously is carried out. To conclude the final release of the useful layer, that is to say the seismic mass from the substrate, a last etching of the silicon oxide pavings is carried out with a solution of hydrofluoric acid taking care not to damage too much the anchorings made on both sides of the seismic mass.

Figure 8:
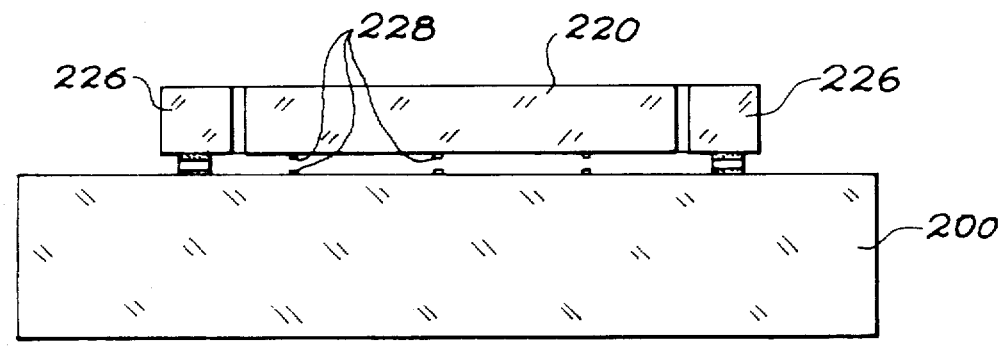
FIG. 8 is a diagrammatic section VIII—VIII of the accelerometer of FIG. 7.

After rinsing and drying, the structure of FIG. 8 is obtained. In this Figure the substrate 200, the seismic mass 220, the beams 226 and the abutments 228 made in accordance with the method described above can be distinguished.

Finally, in a wide variety of applications the invention allows, parts of a micro-mechanical structure to be detached, without the risk of subsequent sticking of those parts. This is possible thanks to the invention, without a step of lithography or of extra etching and by only making use of known chemical reactions which are simple to carry out.

Furthermore, the method of the invention can be implemented even in the case where the parts sensitive to sticking are not located on the surface of the structure.

DOCUMENTS MENTIONED IN THE DESCRIPTION (1)

Supercritical Carbon Dioxide Drying Microstructures, G. Mulhern et al., 7th International Conference on Solid State Sensors and Actuators, pp. 296 to 299

(2)

EP-A-0 386 464

(3)

U.S. Pat. No. 4,999,735

(4)

Surface Roughness Modification of Interfacial Contacts in Polysilicon Microstructures, R. L. Alley et al., 7th International Conference on Solid State Sensors and Actuators, pp. 288 to 291.

We claim:

1. A method of detaching a useful layer, initially connected to a substrate by a sacrificial layer, comprising:

a first partial and selective etching of the sacrificial layer leaving at least one paving to survive forming a spacer between the substrate and the useful layer;

a second selective etching of at least one of the useful layer and the substrate using the spacer as a mask so as to form at least one abutment in said at least one of the useful layer and the substrate etched by the second selective etching; and removal of said spacer.

2. A method according to claim 1 characterised in that the first and the second etchings are carried out by a wet route through at least one opening made in the useful layer.

3. A method according to claim 2, wherein the first etching is carried out, starting from each opening made in the useful layer, over a distance D approximately equal to $(L-e)/2$, where L is the maximum distance between neighboring openings made in the useful layer and e is a desired characteristic dimension of the abutments.

4. A method of manufacturing a structure comprising a useful layer held at a distance from a substrate by abutments formed in at least one of the useful layer and the substrate using the method of detaching of claim 1, wherein said method of manufacturing is preceded by the step of:

the formation of an initial structure comprising a stack of substrate, sacrificial layer and a useful layer, the sacrificial layer connecting the useful layer to the substrate.

5. A method of manufacture according to claim 4, characterised in that the initial structure is of the silicon on an insulator type.

6. A method of manufacturing a structure according to claim 4, wherein the useful layer and the substrate are equipped with electrical means for measuring a relative displacement of the useful layer with respect to the substrate by an acceleration, in order to form an accelerometer in which the useful layer is the mobile sensitive means.

7. The method of claim 1, wherein the second selective etching is of the useful layer only.

8. The method of claim 1, wherein the second selective etching is of the substrate only.

9. The method of claim 1, wherein the second selective etching is of both the useful layer and the substrate.

* * * * *